United States Patent [19]

Campisi

[11] Patent Number: 5,023,726
[45] Date of Patent: Jun. 11, 1991

[54] UNITARY CHASSIS FOR TELEVISION RECEIVERS WITH TWO CIRCUIT BOARDS AND METHOD OF MANUFACTURE

[75] Inventor: Carl Campisi, Chicago, Ill.

[73] Assignee: Zenith Electronics Corporation, Glenview, Ill.

[21] Appl. No.: 442,283

[22] Filed: Nov. 28, 1989

[51] Int. Cl.⁵ ............................................. H04N 5/645
[52] U.S. Cl. .................................... 358/254; 361/395; 361/420
[58] Field of Search ............... 455/346, 347, 348, 349; 358/254, 255; 361/395, 420, 417, 419, 391

[56] References Cited

U.S. PATENT DOCUMENTS

| | | | |
|---|---|---|---|
| 3,005,049 | 10/1961 | Yoder | 358/254 |
| 3,531,723 | 9/1970 | Watanabe | 358/254 |
| 4,618,915 | 10/1986 | Bury | 361/420 |
| 4,873,578 | 10/1989 | Tognoni | 358/254 |
| 4,899,256 | 2/1990 | Sway-Tin | 361/395 |

FOREIGN PATENT DOCUMENTS 2347442  4/1974  Fed. Rep. of Germany ...... 361/412

Primary Examiner—Edward L. Coles, Sr.

[57] ABSTRACT

A unitary chassis for a full line of television receivers that includes only two circuit boards that contain all receiver circuitry and components designed to facilitate more frequent and easier change from manufacturing one model to another in the line. The boards are generally identified as the power supply board and the signal board and both are slidably mounted in a chassis frame identical for all receivers in the line. Only the circuitry on the boards varies from one model to another and the dimensions of the boards remain the same. The boards are made on two assembly lines and because of uniform board size and the use of common components, these lines can be quickly changed from one model to another. A jack pack is also provided, identical for all models and mounted in the same location on the signal board throughout the line.

15 Claims, 10 Drawing Sheets

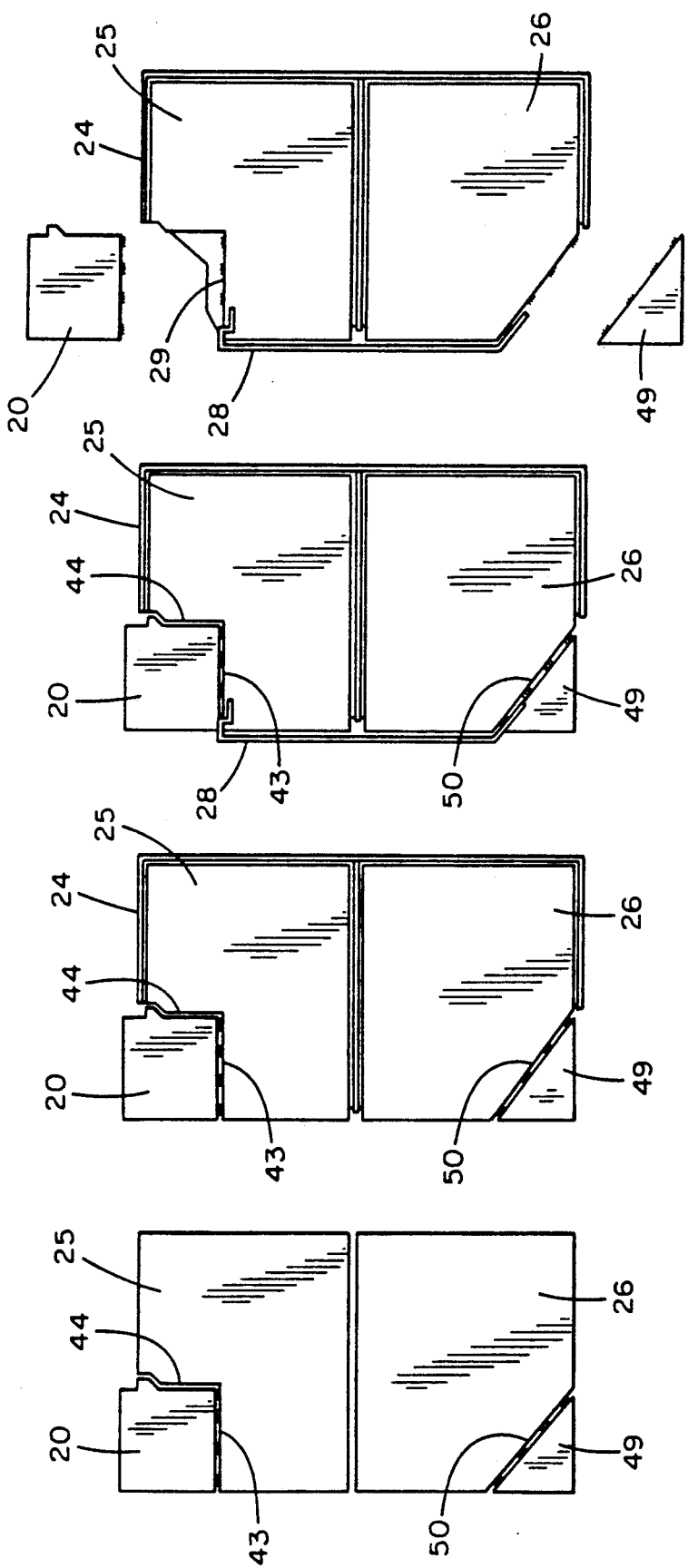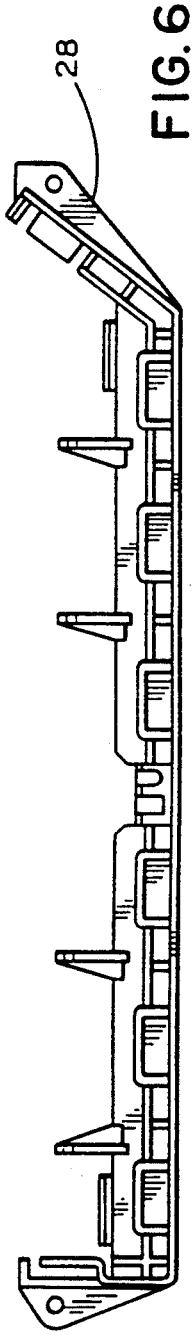
FIG. 5
FIG. 6

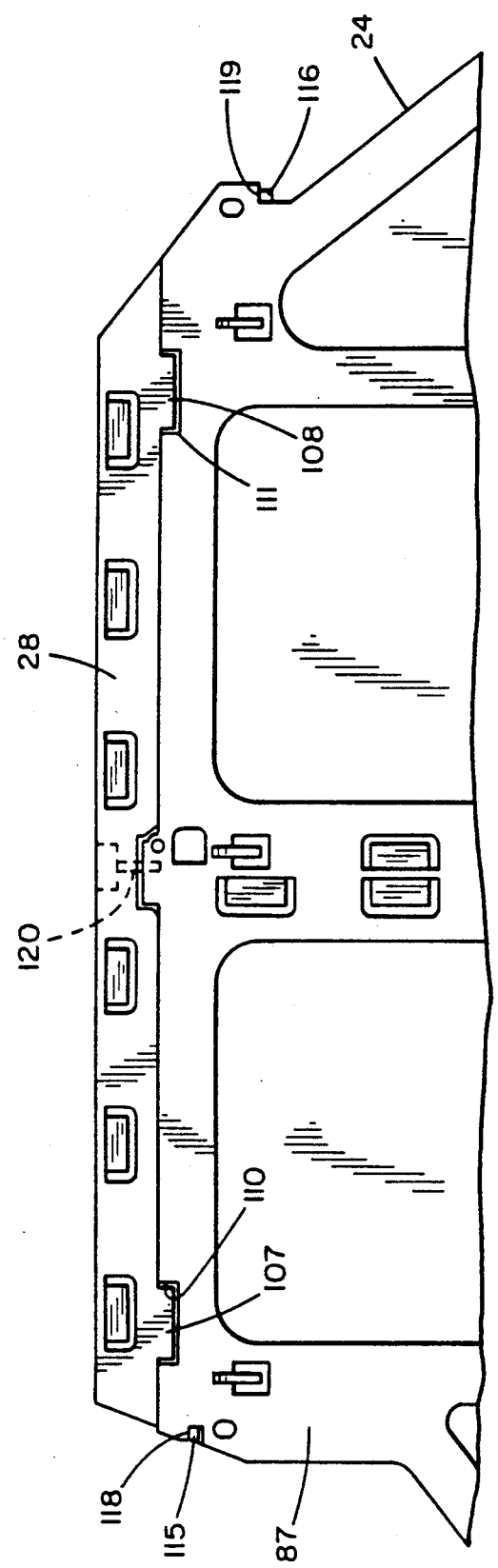
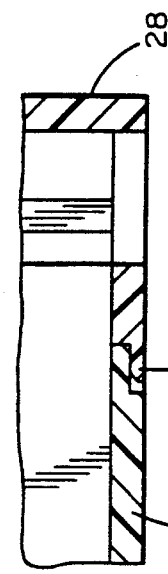
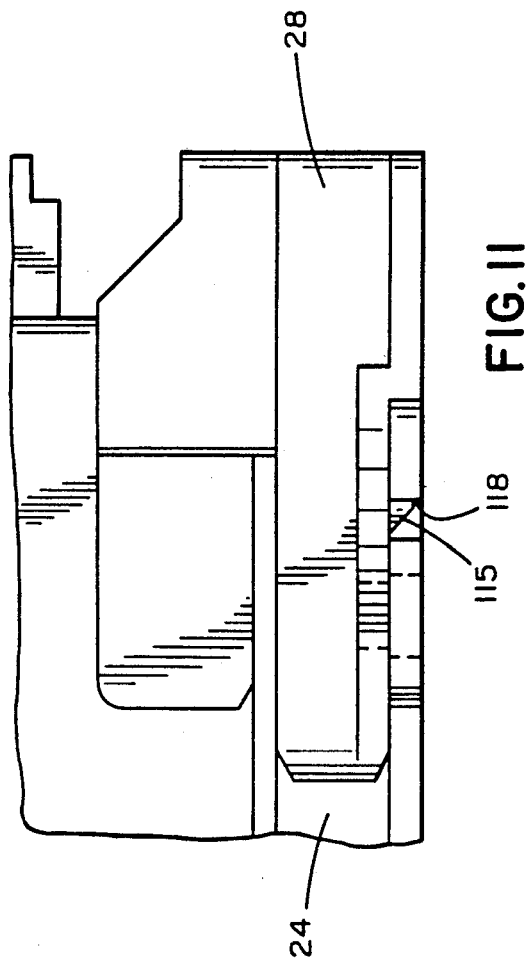

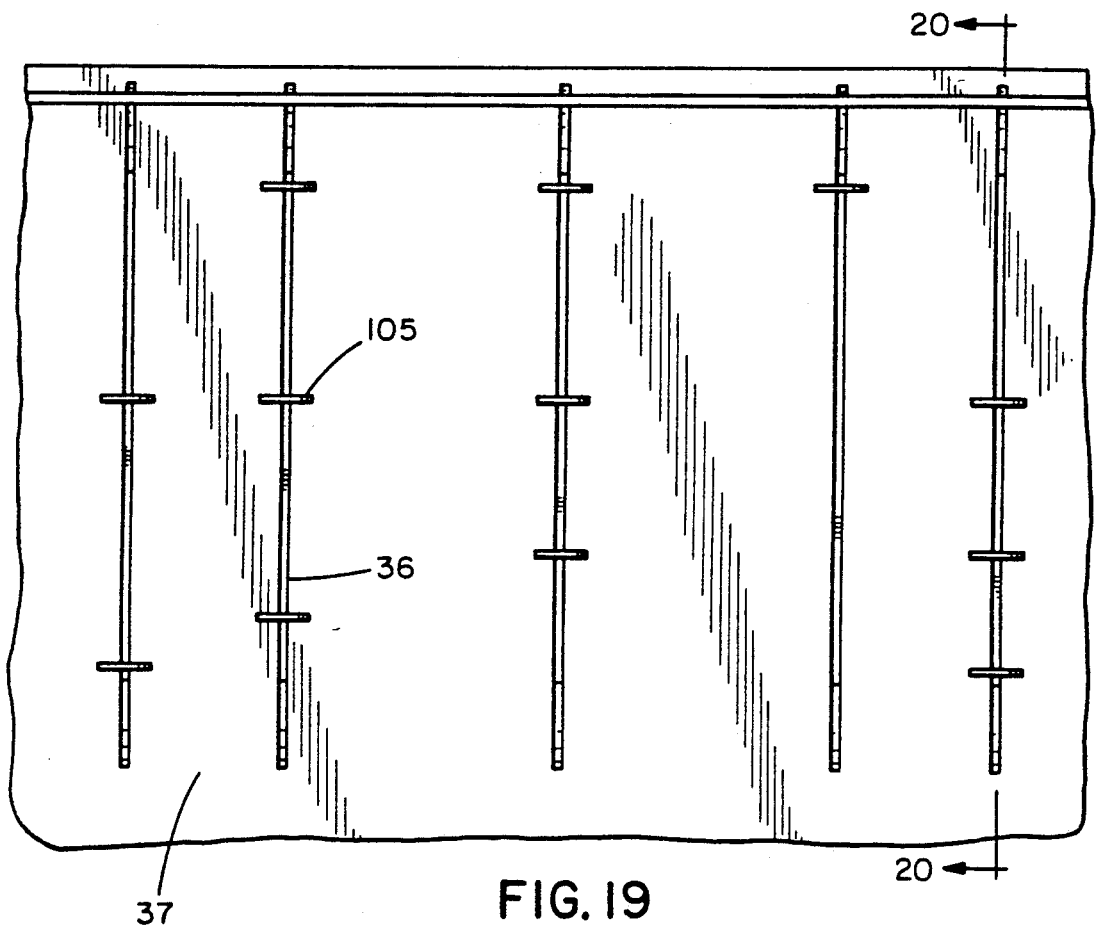
FIG. 19
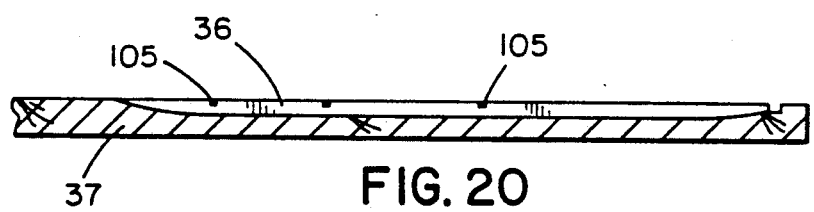
FIG. 20
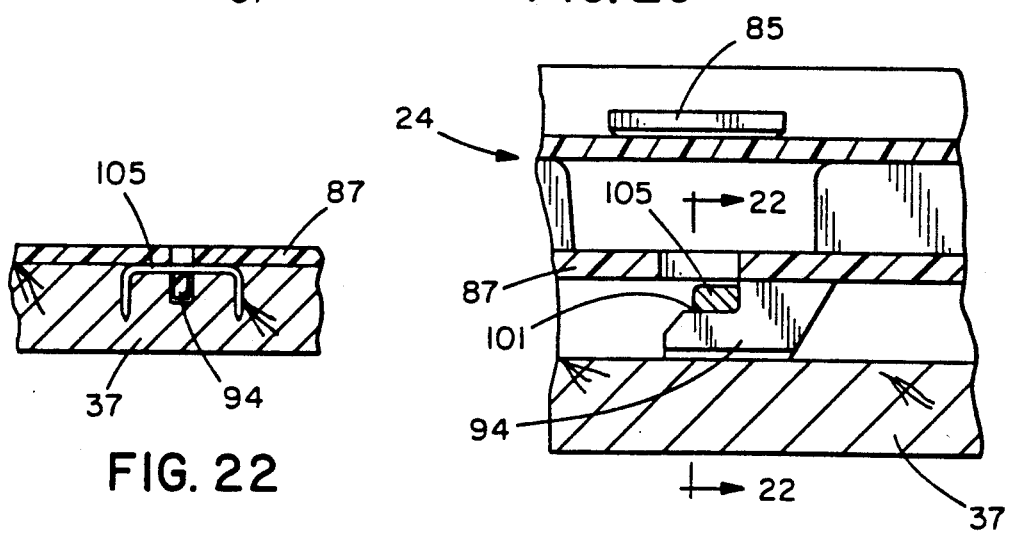
FIG. 22
FIG. 21

UNITARY CHASSIS FOR TELEVISION RECEIVERS WITH TWO CIRCUIT BOARDS AND METHOD OF MANUFACTURE

BACKGROUND OF THE INVENTION AND PRIOR ART

Over recent years it has been increasingly difficult to manufacture television receivers entirely at one location because of unit labor costs. In many instances the CRT will be made at one location, the chassis another and the cabinet a third.

These three components must be brought together and assembled at one of the component locations or at a separate assembly plant. This divided manufacture is particularly useful for United States final assembly because United States unit labor costs are relatively high compared to many other parts of the world. It enables components that are labor intensive to be manufactured in a different country and shipped to an assembly location in the United States.

The divided manufacture of the chassis and associated circuitry has created unique problems. One of these results from the inability to test all the chassis circuitry at the chassis manufacturing location.

The chassis commonly includes R. F. and cable input circuitry, power supply circuitry, signal circuitry, circuitry for special features such as MTS stereo, video or CRT driving circuitry, and a jack receiving unit sometimes referred to as a "jack pack". These circuits or components are usually divided into a plurality of boards that are separately screwed into the cabinet at the final assembly location.

These separate boards are tested individually at the chassis manufacture location, but cannot be tested and trimmed there together because the individual boards and components are not dedicated to one another at the chassis assembly location.

Therefore, after the boards are shipped to the final assembly location and brought together in a single cabinet, the combination of boards are trimmed and tested. If at that point one or more of the boards is rejected, there is no capability of correcting the defective board because that capability is usually or conveniently only at the chassis manufacture location.

Thus, it would be highly desirable to dedicate all these boards and components at the chassis location so they may be trimmed and tested before shipment to the final assembly location. The final assembly location would then only have to insert the chassis, connect the video circuitry to the CRT, and testing would be largely limited to the CRT driver trimming. The present invention accomplishes these objectives.

Another problem in prior chassis assembly techniques is that the individual boards are connected with small screws to the cabinet. The use of these small screws inevitably results in extra loose screws in the cabinet even with good quality control. The extra screws are not a significant cost problem, but these loose screws can short circuitry or become wedged in locations that inhibit removal of components for repair.

It would, therefore, be desirable to eliminate the use of screws for these chassis components.

A still further problem is at the chassis manufacture location where four or more separate manufacturing lines are utilized to make the chassis components including R.F. and cable input circuitry, power supply circuitry, signal circuitry, circuitry for special features such as MTS stereo, video or CRT driving circuitry, and the jack pack.

The power supply componets change with the size of the picture tube. The additional feature circuitry varies with the particular receiver model. These variations make it difficult to change manufacturing lines from one model to another, and the resulting reticence to change frequently from one model to another, encourages excess inventories of certain models which down the economic line reduces corporate profits, and increases costs.

Therefore, it would be desirable to reduce the number of manufacturing lines at the chassis location and encourage and facilitate changing lines from one model to another, and the present invention accomplishes this objective.

The same problem is exacerbated by the different chassis sizes from one receiver to another. The physical size and configuration of the chassis components for a console are frequently dramatically different from table top units and these differences require greater changes in the manufacturing lines when switching models.

The present invention eliminates or minimizes this problem by providing a common chassis configuration for the entire array of television receivers from table top to large consoles.

A further object of the present invention is to provide a common configuration and location for the jack pack throughout the lines of television receivers.

SUMMARY OF THE PRESENT INVENTION

In accordance with the present invention, a unitary chassis is provided for a television manufacturer's full line of receivers that includes only two circuit boards that contain all circuitry and components for the receiver that permit far easier change from one model to another in the manufacturing process.

The two boards are identified as the power supply board and the signal board. The power supply components of course vary from one model to another but the physical dimensions of the board remain the same.

The signal board includes input circuitry, tuner circuitry, additional features circuitry such as MTS stereo, video circuitry and a commonly located jack package.

Only some of these signal board components change from one model to another, but again the board configuration and physical dimensions remain exactly the same from one model to another.

This division of boards into a signal board and a power supply board with common physical dimensions enables all circuitry to be produced in two manufacturing lines, one for each board. The reduction in manufacturing lines from present techniques and a common physical shape for the power supply boards and a common shape for the signal boards make it far easier to change the two lines from one model to another. Hence, it encourages more frequent shifts and reduces finished receiver inventory increasing profits. It also lowers unit costs.

Another feature of the present invention is an identical jack pack for all models mounted in a common location directly on the signal board with soldered terminals to the board conductors. In addition to eliminating much of the jack pack wiring commonly found today, it reduces unit costs by utilizing the same pack for all models.

BRIEF DESCRIPTION OF THE DRAWINGS

FIG. 5 is a collection of schematic top views illustrating the manufacture of the chassis assembly and particularly the removal of portions of the circuit board and the break away video drive board;

FIG. 6 is a top view of the rear frame member illustrated on the chassis in FIG. 4;

FIG. 10 is a fragmentary top view of the rear of the chassis frame with the rear frame member snap-locked thereto;

FIG. 11 is a fragmented left side view of the rear frame member attached to the chassis frame taken generally along line 11—11 of FIG. 4;

FIG. 12 is a fragmentary section showing the fit between the lower part of the back frame member and the frame, taken generally along line 12—12 of FIG. 4;

FIG. 19 is a fragmentary top view of the bottom panel of the console cabinet illustrated in FIG. 3;

FIG. 20 is a longitudinal section taken generally along line 20—20 of FIG. 19;

FIG. 21 is a fragmentary section illustrating one of the chassis assembly projection hooks engaged in the console bottom panel illustrated in FIGS. 19 and 20, and;

FIG. 22 is a fragmentary cross-section taken generally along line 22—22 of FIG. 21.

DETAILED DESCRIPTION OF THE PREFERRED EMBODIMENT

Figure 1:
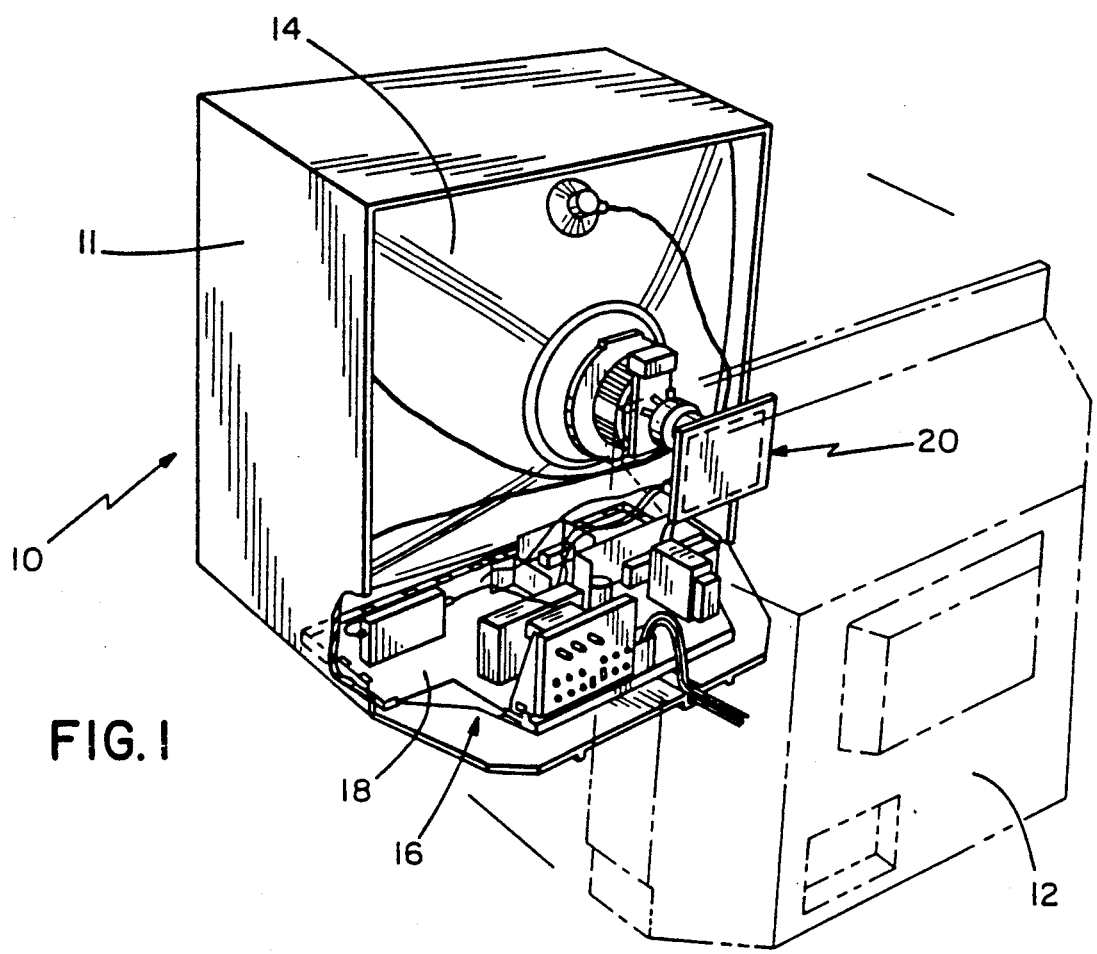
FIG. 1 is a rear perspective view of one television receiver according to the present invention with its rear cover panel removed illustrating its chassis.

Referring to the drawings and particularly FIGS. 1 to 4, a television receiver 10 is illustrated consisting of a table top cabinet 11 having a removable rear cover panel 12, a cathode ray tube 14 and a unitary chassis assembly 16 removably mounted on cabinet bottom panel 18.

The chassis assembly 16 initially includes a video drive circuit board 20 that is mounted to the rear of the CRT 14 upon final assembly as will appear more clearly hereinafter.

Figure 3:
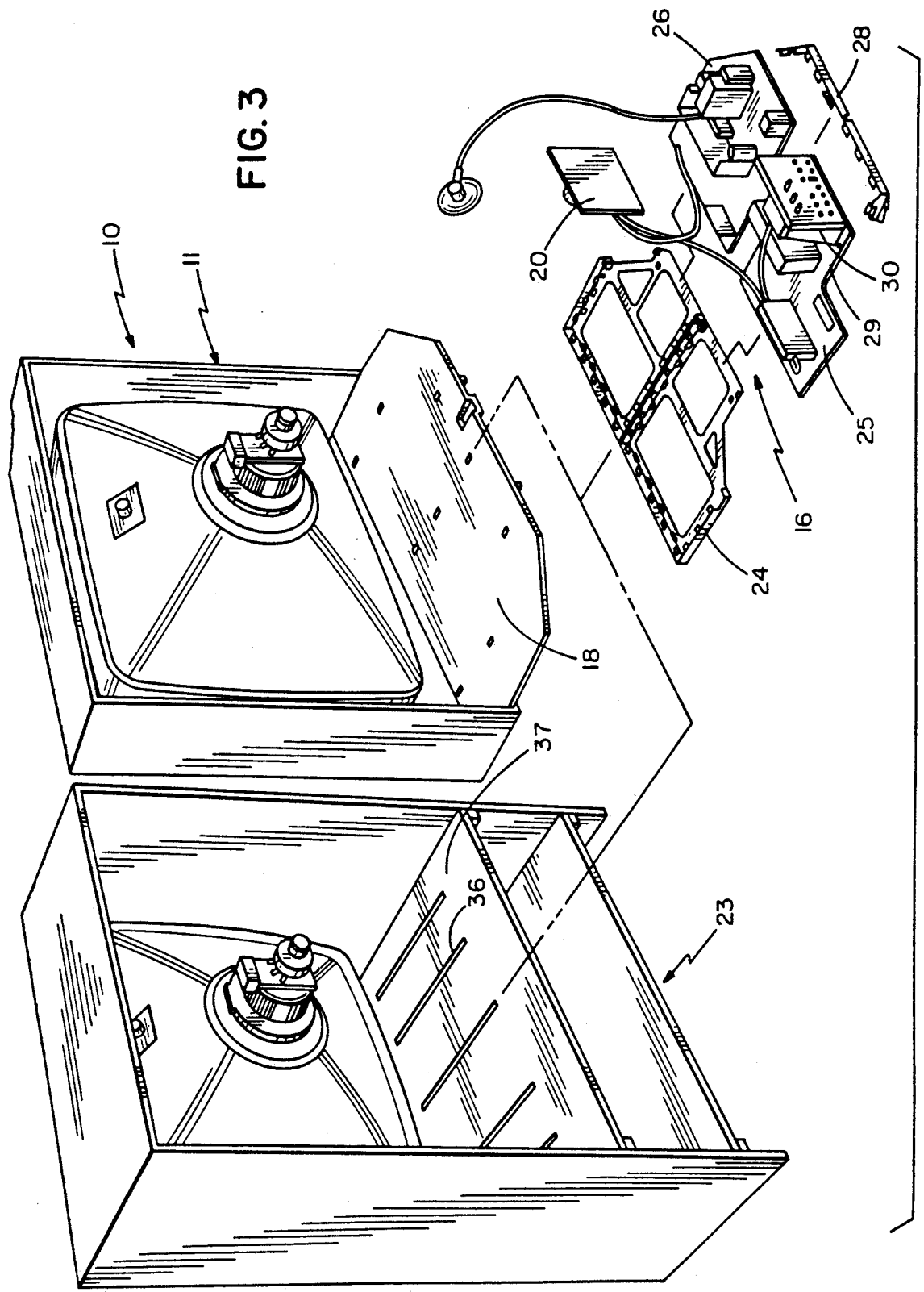
FIG. 3 is an exploded perspective illustrating the manner of mounting the chassis assembly according to the present invention in both table top and console television receiver models.

As seen in FIG. 3, the chassis assembly 16 with some modification to the circuitry therein, is adapted to be common top receiver 10 illustrated in FIGS. 1 and 3, as well as consoles. Note console cabinet 23 illustrated in FIG. 3.

Figure 2:
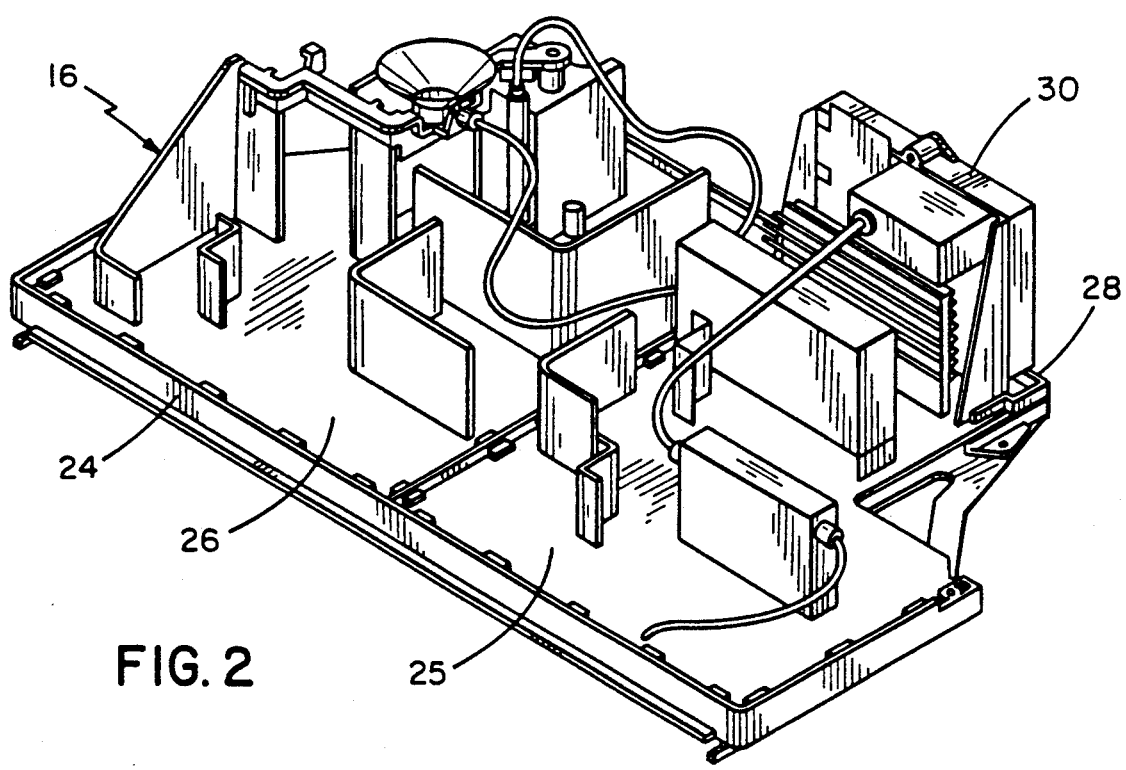
FIG. 2 is a front perspective of a chassis assembly according to the present invention but without the detail of all circuitry contained therein.

As seen clearly in FIGS. 2 and 3, the chassis assembly 16 includes a generally rectangular one-piece plastic injection molded frame 24 having slots that slidably receive a signal board 25 in a left slot therein and a power supply board 26 in a right slot therein. Circuit boards 25 and 26 are held in the chassis frame 24 by a back frame 28 that snap-locks to the rear of the main chassis frame 24 and is secondarily held thereto by a single central screw not shown in FIG. 3.

The signal board 25 as initially manufactured carries the video drive circuit board 20 at its left rear cut-out 29, which is broken away at final assembly and attached to the CRT as illustrated in FIG. 1.

The signal board 25 includes input circuitry, tuner circuitry, circuitry and components for additional features such as MTS stereo, the video circuit board 20 and a jack pack 30.

The signal board 25 is identical in size for all television receiver models with only some of its circuitry and components being modified to accommodate the different models.

The jack pack 30, however, is identical for all models and is mounted in exactly the same location on board 25 regardless of the receiver model. Furthermore, most of the terminals for the jack pack 30 are soldered to conductors on the circuit board 25 eliminating the need for much of the external wiring commonly associated with jack packs.

The power supply board 26 carries all of the power supply circuitry and components for the receiver and some are modified to accommodate different size CRTs in the television line. Similar to the signal board 25, however, the peripheral dimensions of the power supply board 26 remain the same for all models and hence the same chassis frame 24 is used on all receivers in the line.

An important aspect of the present invention is that each of the boards 25 and 26 is manufactured at the chassis manufacturing location on separate lines so that in essence the number of lines utilized to manufacture the chassis is substantially reduced over present technology. However, over and above the reduction in the number of lines required, the identical size configuration of each of the boards 25 and 26 regardless of model, the identical construction and location of jack pack 30 for all models, and the use of many common circuitry components on each of the boards 25 and 26 permit these two manufacturing lines to be easily switched from one model to another, significantly reducing manufacturing costs encouraging more frequent switch over from one model to another which in turn reduces unnecessary inventories.

Figure 4:
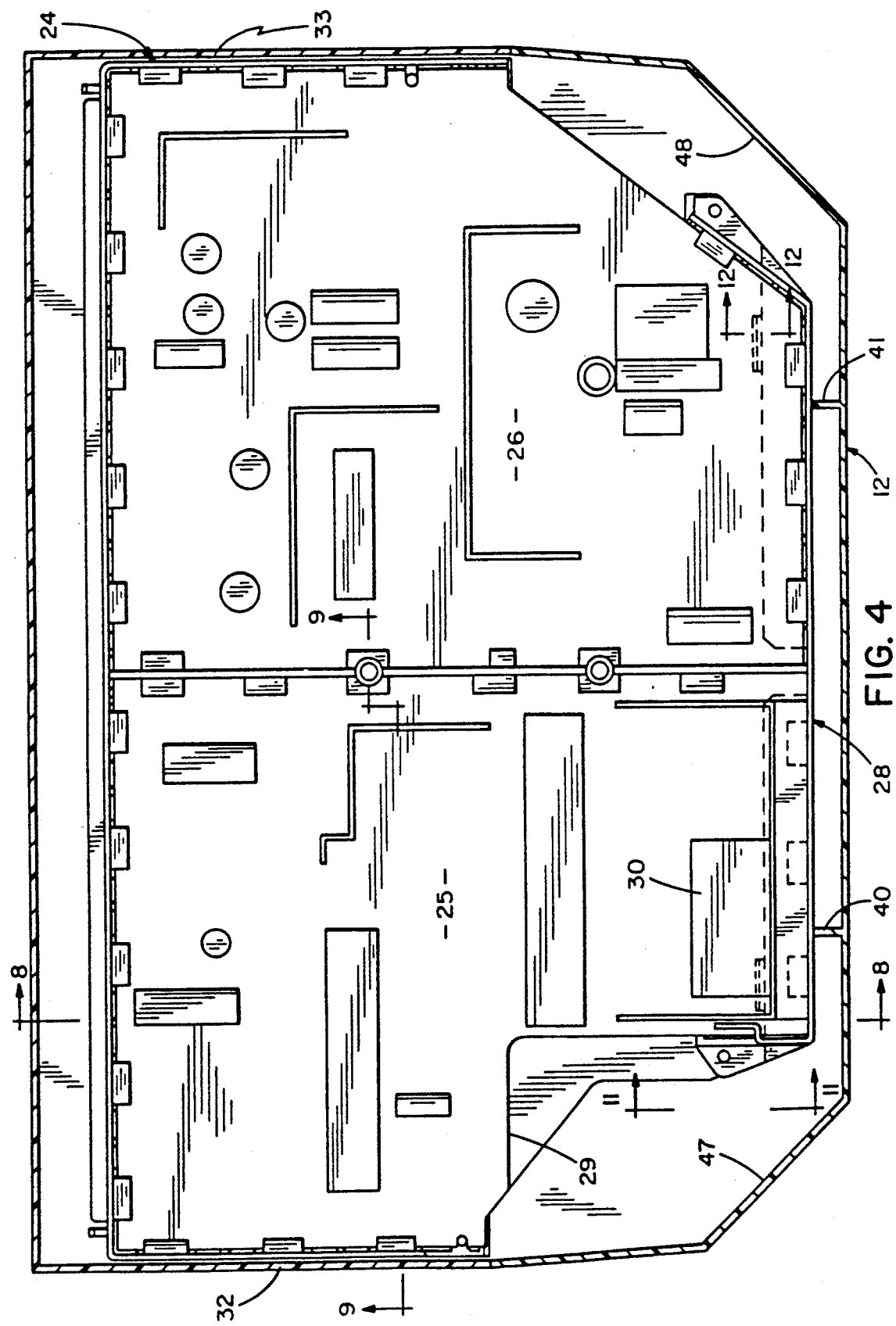
FIG. 4 is an enlarged top view of the chassis assembly illustrated in FIG. 2, again with details of circuitry eliminated for clarity.

As seen in FIG. 4, the sides of frame 24 are spaced just slightly inside cabinet side walls 32 and 33 so that as the chassis in slid into the cabinet, the cabinet side walls assist in guiding the chassis toward its locking position where it drops in and engages either rectangular apertures 34 in table top cabinet bottom panel 18 or slots 36 in console cabinet bottom panel 37, both shown in FIG. 3 and also described in more detail below.

As also seen in FIG. 4, the rear cover panel 12 has a pair of forwardly projectly integral stops 40 and 41 that engage the rear frame 28 and prevent the chassis from sliding rearwardly in the cabinet.

Viewing FIG. 5 in which a series of four diagrammatic top views of the main boards 25 and 26 is illustrated, in manufacture a rectangular video board 20 is originally formed as part of the signal board 25 with perforated L-shaped cut lines 43 and 44 that are sufficiently extensive to permit the manual break away of the video board 20 at the final assembly location. The video board 20 is located at the left rear of the signal board 25 in a position where some of board 25 would have to be cut away anyway to prevent interference with the rearwardly converging side wall 47 in the rear cover panel 12 as seen in FIG. 4. Furthermore, the location of video board 20 at the left rear of board 25 places it in a very convenient location for removal by the final assembler as he or she inserts the chassis into one of the cabinets.

The signal board 26, also as seen in FIG. 5, has a break away corner piece 49 at its right rear corner defined by diagonal perf cut line 50 in a similar manner to board 25, permitting it to be broken away but in this case discarded. Cut line 50 accommodates the tapered converging side wall 48 on rear cover panel 12 as seen in FIG. 4.

Figure 7:
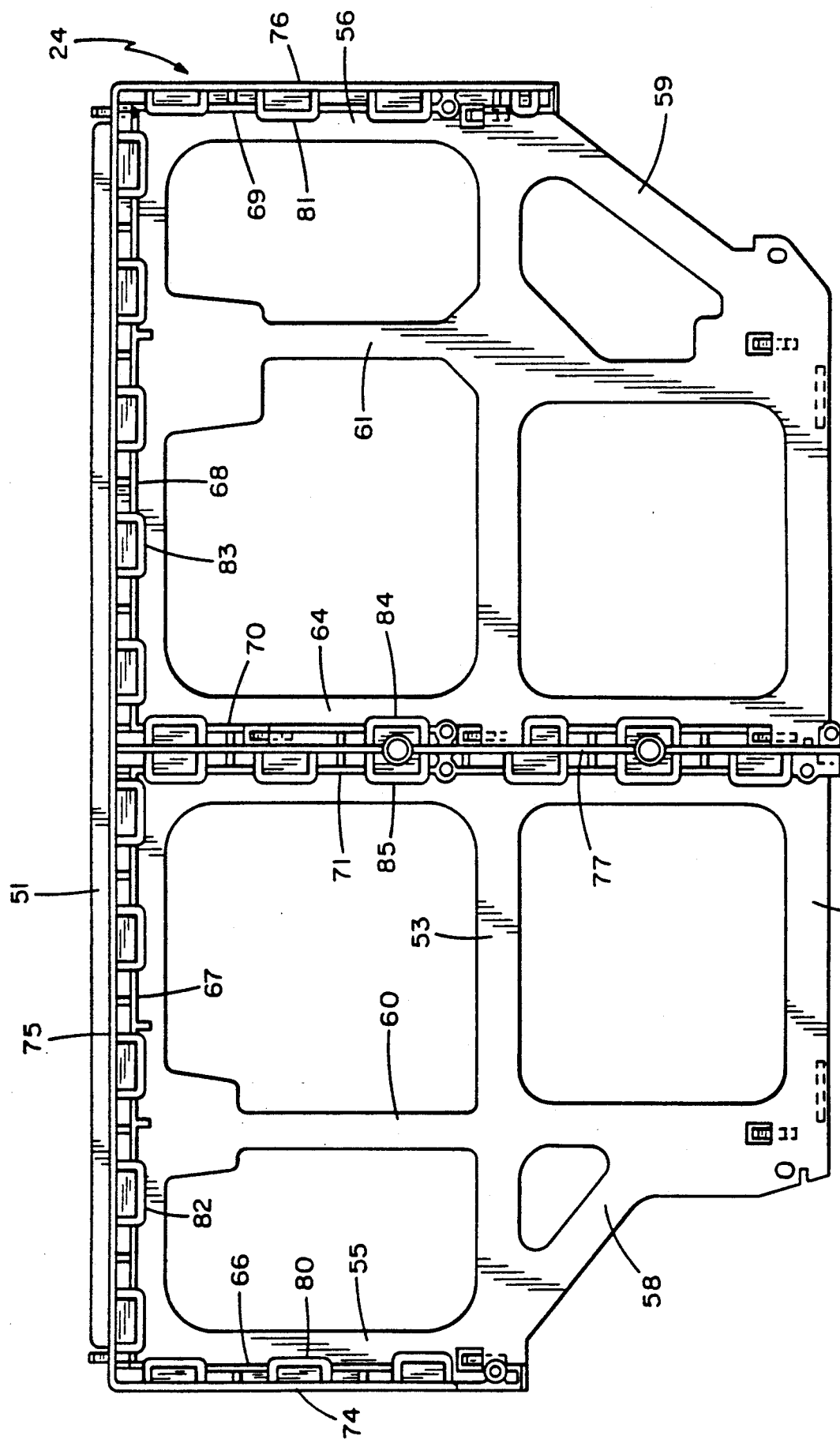
FIG. 7 is a top view of the chassis frame illustrated in FIG. 4 with the signal and power supply boards removed.

The details of the chassis frame 24, back frame member 28 and their manner of attachment to the cabinets are illustrated in FIGS. 6 to 12 and 14 to 22, and as seen from the top view of the frame illustrated in FIG. 7, it is a one-piece plastic injection molding of generally rectangular configuration including a front bar 51 parallel to a rear bar 52 and an approximately centrally positioned bar 53 connected together by left and right side bars 55 and 56 and generally rearwardly converging side bar portions 58 and 59. Stiffening bars 60 and 61 are provided parallel to the side bars 55 and 56. A forwardly extending central bar 64 is also provided between front and rear bars 51 and 52.

Figure 8:
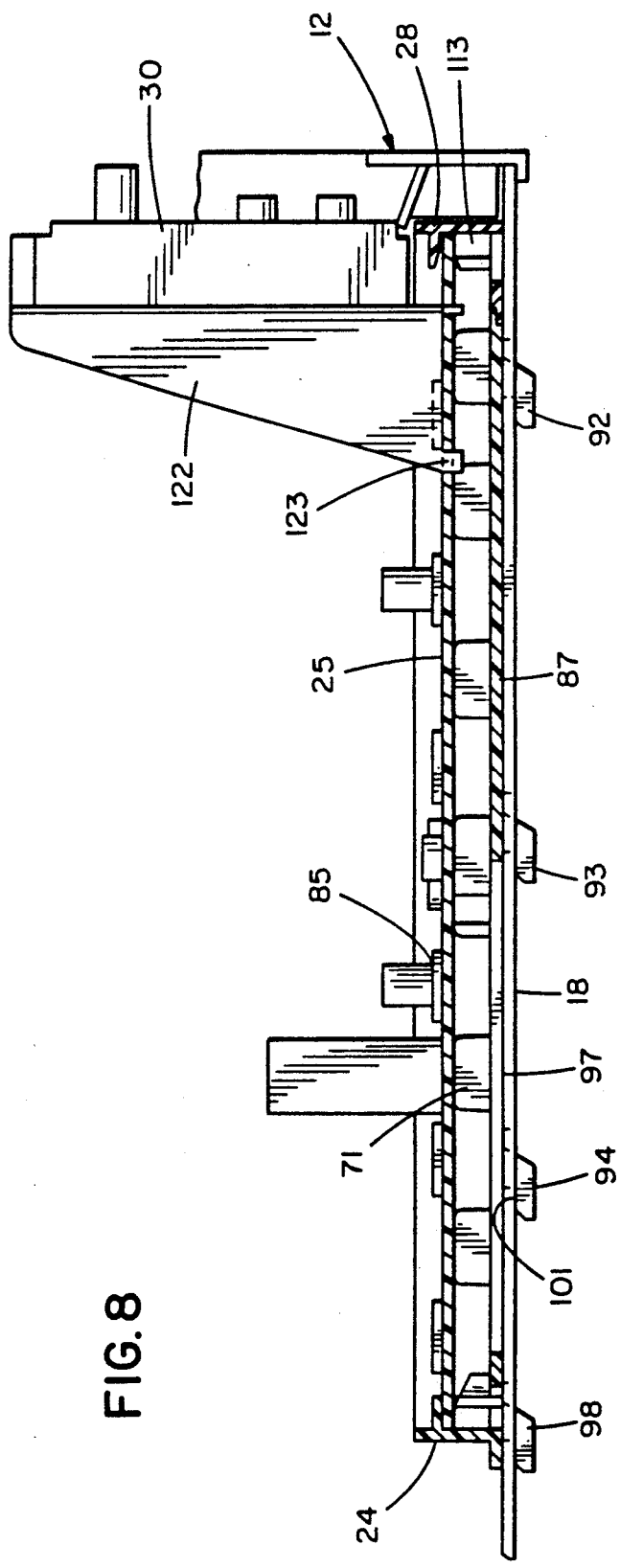
FIG. 8 is a cross-section of the chassis taken generally along line 8—8 of FIG. 4 illustrating the manner of mounting the circuit boards in the chassis frame.
Figure 9:
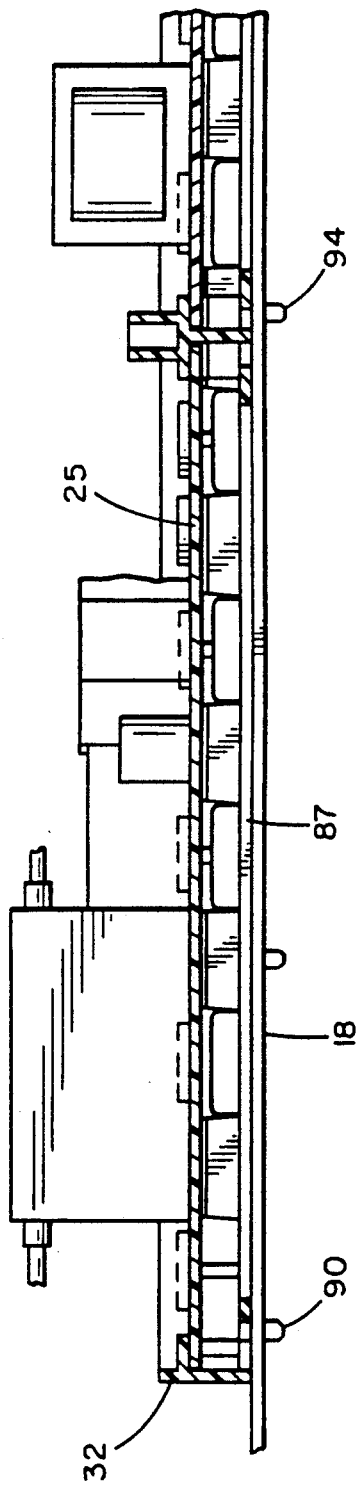
FIG. 9 is a fragmentary longitudinal section taken generally along line 9—9 of FIG. 4.

The frame 24 has two slots for respectively receiving left board 25 and right board 26 and toward this end, the side bars 55, 56, the front bar 51, and central bar 64 are each provided with a plurality of upwardly extending T-shaped projections 66, 67, 68, 69, 70 and 71 that have coplanar upper surfaces that slidably receive and engage the lower surfaces of the boards 25 and 26. The side bars 55, 56, the front bar 51 and central bar 64 are also provided with vertical upstanding walls 74, 75, 76 and 77 from which project a plurality of horizontally extending identical tabs 80, 81, 82, 83, 84 and 85 that have coplanar lower surfaces that slidably engage the upper surfaces of the boards 25 and 26. Tabs 80, 81, 82, 83, 84 and 85 are alternately positioned in the plane of FIG. 7 with the T-shaped projections 66, 67, 68, 69, 70 and 71. As seen in FIG. 8, T-shaped projections 71, etc. are spaced from horizontal tabs 85, etc. a distance slightly greater than the thickness of the boards 25 and 26 to engage but freely slidably receive the boards.

Figure 14:
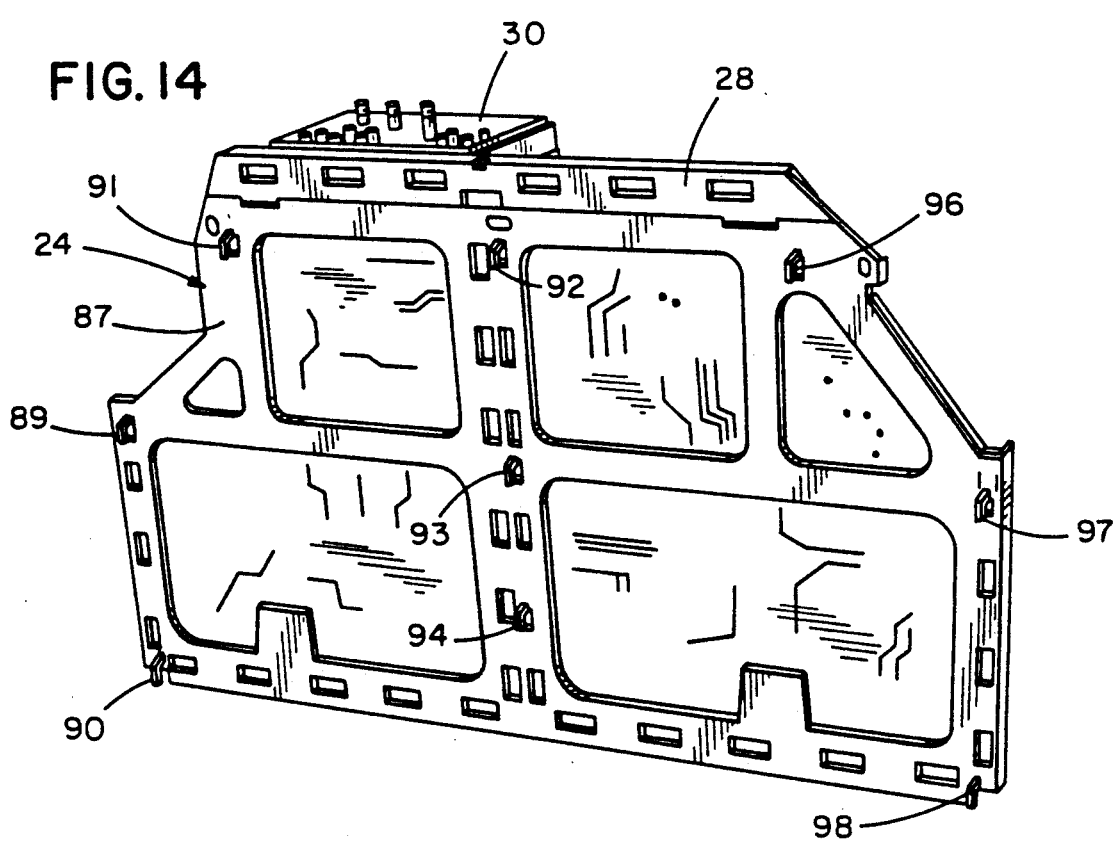
FIG. 14 is a bottom perspective of the chassis assembly according to the present invention also showing the rear of the jack pack.
Figure 15:
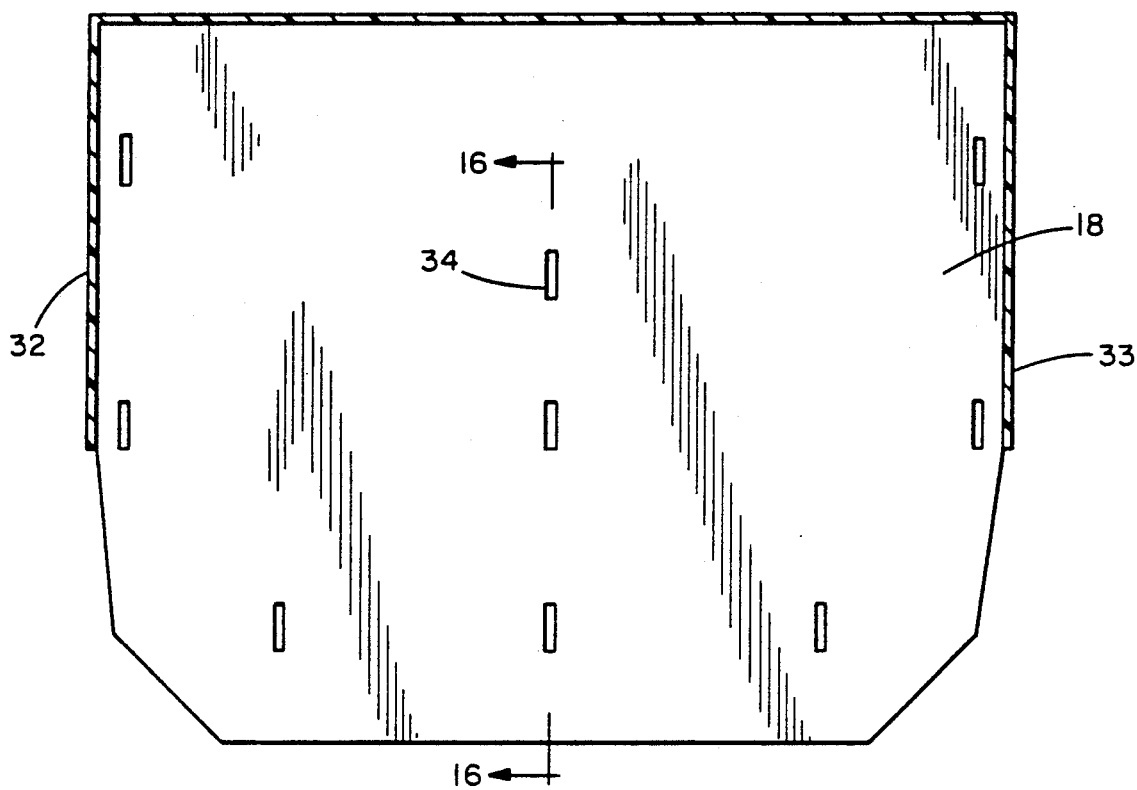
FIG. 15 is a top view of the cabinet bottom panel of the table top receiver illustrated in FIG. 3.
Figure 16:
FIG. 16 is a longitudinal section taken generally along line 16—16 of FIG. 15 showing the bottom wall apertures in the cabinet.
Figures 17, 18:
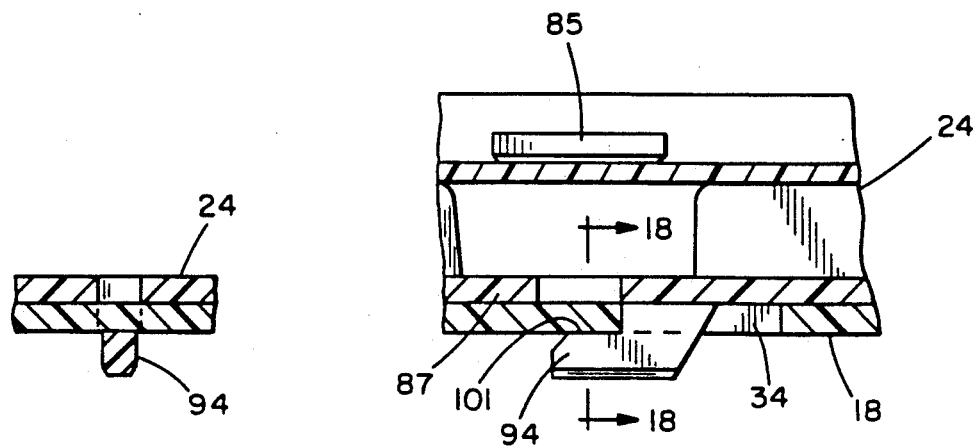
FIG. 17 is a fragmentary section showing one of the chassis assembly projections engaged in one of the table top apertures illustrated in FIGS. 15 and 16.
FIG. 18 is a fragmentary cross-section taken generally along line 18—18 of FIG. 17.

The chassis assembly 16 is designed to be connected to the bottom wall of the cabinets with a friction fit and without the use of tools. As seen in FIG. 14, there are a plurality of downwardly and forwardly projecting integral hooks from the lower surface 87 of the frame 24 including hooks 89, 90, 91, 92, 93, 94, 96, 97 and 98.

As seen more clearly in FIG. 8, each of these hooks has a horizontal upper surface 101 spaced from frame bottom wall 87 by the thickness of cabinet bottom wall 18. This relationship is shown enlarged in FIGS. 17 and 18, and in this way the hooks extend through apertures 34 and grip the lower surface surface of the cabinet bottom wall frictionally holding the chassis 16 to the bottom wall.

As seen in FIGS. 15, 16, 17 and 18, the apertures 34 in the cabinet bottom wall 18 are elongated forward to rear so that as the assembler slides the chassis forwardly into the cabinet, the frame hooks simultaneously drop into the identically positioned apertures 34 in the bottom wall 18 and with a further forward push against the back of the back frame member 28, the chassis slides slightly further forwardly frictionally engaging the frame hooks to the underside of the bottom wall 18.

The same frame hooks 89, 90, 91, 92, 93, 94, 96, 97 and 98 are utilized to hold the chassis in the console cabinet 23 shown in FIG. 3 and illustrated in enlarged detail in FIGS. 19 to 21. The bottom wall 37 of the console has five slots 36 therein spaced the same as the rows of hooks in the lower surface of frame 24 and each of these slots has staples 105 there-across located at the desired position with respect to the final position of the chassis such that they are engaged by the underside of the hooks all in a similar manner to the staple 105 and hook 94 illustrated in FIGS. 21 and 22.

In a similar manner to the table top cabinet, the chassis is slid forwardly on the console bottom wall 37 until each of the hooks drops into the slots 36 just behind the associated staple 105 and then with a further forward push the hooks engage the underside of the staples frictionally locking the chassis to the cabinet.

As described above, the stops 40 and 41 on the cabinet back panel engage the chassis frame to prevent disengagement of the hooks from the apertures 34 in the table top bottom wall and the staples 105 in the console bottom wall.

As seen in FIGS. 4, 7, 8, 10, 11 and 12, the back frame 28 snap-locks to the main chassis frame 24 and toward this end the back frame is provided with a pair of spaced forwardly extending tabs 107 and 108 (see FIGS. 10 and 12) that engage in complementary shallow recesses 110 and 111 in the rear bottom surface 87 of the chassis frame, which along with a plurality of forwardly projecting vertical tabs 113 (only one of which is shown in FIG. 8), prevent vertical movement of the back frame 28 with respect to chassis frame 24. Rearward sliding of the back frame 28 is prevented by a pair of integral detents 115 and 116 projecting downwardly from the back frame that respectively frictionally engage shoulders 118 and 119 on the frame 24. Frame 28 is attached to frame 24 by tilting it slightly downwardly as the tabs 107 and 108 engage in recesses 110 and 111 and then pivoting it upwardly so that vertical tabs 113 engage the top of frame wall 87 and the detents 115 and 116 frictionally engage shoulders 118 and 119. An optional central screw 120 may also be utilized if desired to provide additional fastening effort between the back frame 28 and the chassis frame 24.

Figure 13:
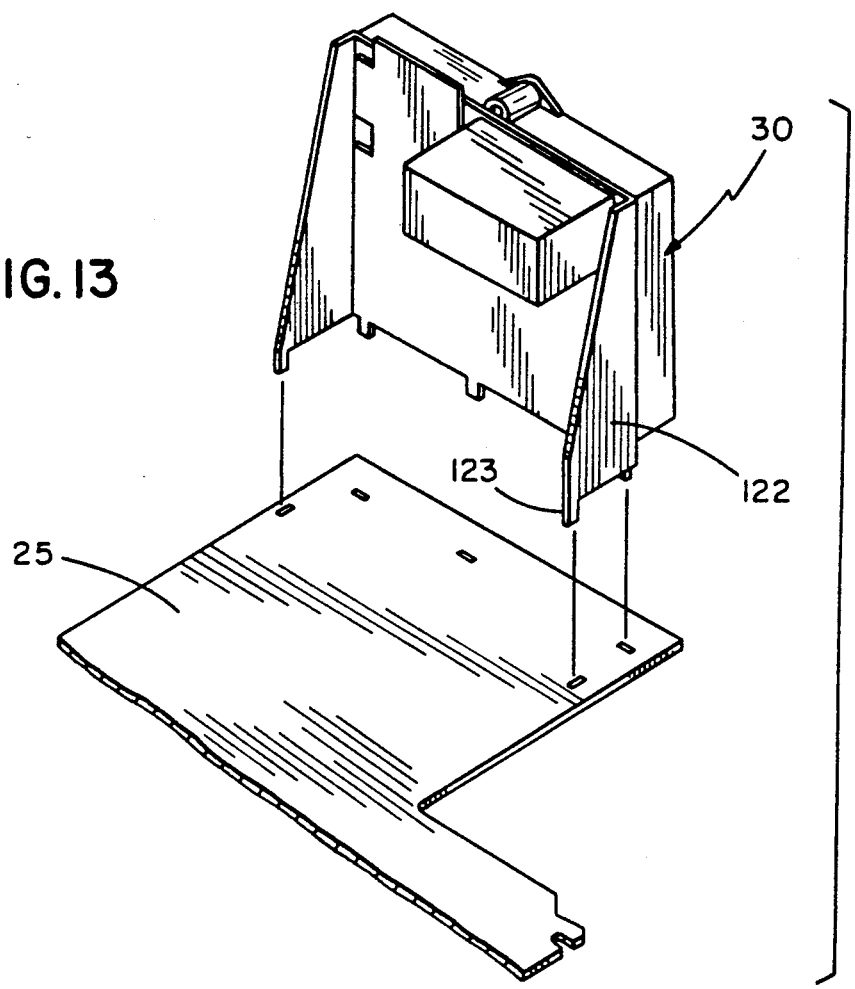
FIG. 13 is a fragmentary exploded perspective view of the rear part of the signal board illustrating the manner of the mounting the jack pack thereto.

As noted above the jack package 30 is identical for all receivers in the line and as seen in FIG. 13, includes a U-shaped frame 122 having downwardly projecting tabs 123 that fit through the signal board 25 and deform to fasten the jack pack 30 to the board. The various terminals associated with the jack pack 30 are soldered to wiring on the board but such has not been illustrated in FIG. 13 for simplification, but it should be understood that these connections are identical for the entire line of receivers and the pack is also located in the same position on board 25 for all receivers considerably simplifying manufacturing and assembly over present techniques.

What is claimed is:

1. Standard chassis assemblies for a plurality of television receivers in a line of receivers having different sized CRTs, comprising: a plurality of identically sized plastic frames, each of the frames including a first identically sized circuit board receiving slot and a second identically sized circuit board receiving slot, a plurality of first circuit boards containing power supply components that provide power for components of the receiver, some of said first circuit boards having a first power level capacity and some of said first circuit boards having a second power level capacity to accommodate smaller and larger CRTs, and a plurality of second circuit boards containing video input and video driving circuitry substantially common to receivers having different sized CRTs, said first circuit boards being selectively mountable in the first slots of the frames with the second circuit boards in the second slots in the frame, to provide a plurality of chassis assemblies for different sized television receivers.

2. Standard chassis assemblies for a plurality of television receivers in a line of receivers having different sized CRTs as defined in claim 1, wherein the second circuit boards have a break away portion containing video drive circuitry adapted to be broken away at the final assembly location and mounted to the rear of a C.R.T.

3. Standard chassis assemblies for a plurality of television receivers in a line of receivers having different sized CRTs as defined in claim 1, wherein the second circuit boards have a jack pack mounted on the rear thereof having soldered terminals to the second circuit board.

4. Standard chassis assemblies for a plurality of television receivers in a line of receivers having different sized CRTs as defined in claim 1, wherein the frames are a one-piece plastic molding having a generally midline partition separating the first and second circuit boards, said frame first slot being on one side of the partition for receiving the first circuit boards and said second slot being on the other side of the partition for slidably receiving the second circuit boards, said frame slots holding the first and second circuit boards without any fasteners extending into the circuit boards.

5. Standard chassis assemblies for a plurality of television receivers in a line of receivers having different sized CRTs as defined in claim 4, including a plurality of identical rear frame brackets for preventing rearward sliding movement of the first and second circuit boards in the frames.

6. Standard chassis assemblies for a plurality of television receivers in a line of receivers having different sized CRTS as defined in claim 5, wherein the rear frame brackets have snap lock connectors to the frames.

7. Standard chassis assemblies for a plurality of television receivers in a line of receivers having different sized CRTS as defined in claim 4, wherein the slot means are defined by a plurality of horizontal tabs on the frames extending in a first common plane and a second plurality of horizontal tabs extending in a second common plane spaced from the first plane a distance approximately the thickness of the circuit boards.

8. Standard chassis assemblies for a plurality of television receivers in a line of receivers having different sized CRTs, comprising: a plurality of identically sized plastic frames, each of the frames including a first identically sized circuit board receiving slot and a second identically sized circuit board receiving slot, each of the slots being defined by a plurality of integral horizontal projections on the frames extending in a common plane and a second plurality of integral horizontal projections on the frame extending in a common plane spaced from the first common plane by the thickness of the circuit boards, a plurality of first circuit boards containing substantially all of the power supply components that provide power for components of the receiver, some of said first circuit boards having a first power level capacity and some of said first circuit boards having a second power level capacity to accommodate smaller and larger CRTs, a plurality of second circuit boards containing substantially all of the jack pack, tuner, video input and video driving circuitry substantially common to receivers having different sized CRTs, said first circuit boards being selectively mountable in the first slots of the frames with the second circuit boards in the second slots in the frame, to provide a plurality of chassis assemblies for different sized television receivers, and means for preventing sliding of the first and second circuit boards in frame slots.

9. Standard chassis assemblies for a plurality of television receivers in a line of receivers having different sized CRTs as defined in claim 8 wherein the means for preventing sliding of the circuitry boards includes a back frame member removably mounted on the frames.

10. Standard chassis assemblies for a plurality of television receivers in a line of receivers having different sized CRTs as defined in claim 9 wherein the means for preventing sliding of the first and second circuit boards is a back frame with integral snap-lock connectors thereon.

11. method of manufacturing standardized chassis for a plurality of different television receivers, including the steps of: molding a plurality of identical plastic frames having first and second spaced circuit board receiving slots therein with all the first slots identical and all the second slots being identical, assembling on a first line a plurality of identically sized first circuit boards having substantially all of the power supply components for the receivers thereon, modifying the first line assembly of the first circuit boards with different power supply components to manufacture different size receivers while maintaining the peripheral dimensions of the board the same to fit the standardized frame first slots, assembling on a second line a plurality of second circuit boards having substantially all the input circuitry, tuning circuitry and video driving circuitry common to different sized receivers, modifying the second line second board assembly to accommodate television receivers having differing additional features such as stereo while maintaining the peripheral dimensions of the board the same to fit the standardized frame second slots, mounting certain of the first boards in one of the frame slots with certain of the second boards in the other frame slot, and testing the completed chassis including the mounted first and second board together prior assembly into a cabinet.

12. A method of manufacturing standardized chassis for a plurality of different television receivers as defined in claim 11, wherein the step of assembling a plurality of second circuit boards includes the step of forming the second circuit boards with substantially all video driving circuitry thereon.

13. A method of manufacturing standardized chassis for a plurality of different television receivers as defined in claim 11, wherein the step of forming the second circuit boards with substantially all video driving circuitry thereon includes forming a manually detachable video board as part of the second boards.

14. A method of manufacturing standardized chassis for a plurality of different television receivers, including the steps of: molding a plurality of identical plastic frames having first and second spaced circuit board receiving slots therein with all the first slots being identical and all the second slots being identical, assembling on a first line a plurality of identically sized first circuit boards having substantially all of the power supply components for the receiver thereon, modifying the first line assembly of the first circuit boards with different power supply components to manufacture different size receivers while maintaining the peripheral dimensions of the board the same to fit the standardized frame first slots, assembling on a second line a plurality of second circuit boards having substantially all the input circuitry, tuning circuitry and video driving circuitry common to different sized receivers, modifying the second line second board assembly to accommodate television receivers having differing additional features such as stereo while maintaining the peripheral dimensions of the board the same to fit the standardized frame second slots, mounting certain of the first boards in one of the frame slots with certain of the second boards in the other frame slot, testing the completed chassis including the mounted first and second boards prior to assembly into a cabinet, and said step of forming the second circuit boards with substantially all video driving circuitry thereon including forming a manually detachable video board as part of the second boards.

15. A method of manufacturing a plurality of different sized television receivers utilizing standardized chassis, including the steps of: molding a plurality of identical plastic frames having first and second spaced circuitr board receiving slots therein with all the first slots being identical and all the second slots being identical, assembling on a first line a plurality of identically sized first circuit boards having substantially all of the power supply components for the receiver thereon, modifying the first line assembly of the first circuit boards with different power supply components to manufacture different size receivers while maintaining the peripheral dimensions of the board the same to fit the standardized frame first slots, assembling on a second line a plurality of second circuit boards having substantially all the input circuitry, tuning circuitry and video driving circuitry common to different sized receivers, modifying the second line second board assembly to accommodate television receivers having differing additional features such as stereo while maintaining the peripheral dimensions of the board the same to fit the standardized frame second slots, mounting certain of the first boards in one of the frame slots with certain of the second boards in the other frame slots, testing the completed chassis including the mounted first and second boards together prior to assembly into a cabinet at the location of manufacture of the first and second circuit boards, shipping the chassis to a distant assembly location, inserting the chassis in cabinets and connecting the video drive circuitry to CRTs in the cabinets at the assembly location, and testing the completed receivers at the assembly locations.

* * * * *